US012599005B2

(12) United States Patent
    Ewald

(10) Patent No.: US 12,599,005 B2
(45) Date of Patent: Apr. 7, 2026

(54) POWER ELECTRONICS MODULE

(71) Applicant: ZF Friedrichshafen AG,
                Friedrichshafen (DE)

(72) Inventor: Ake Ewald, Bayreuth (DE)

(73) Assignee: ZF Friedrichshafen AG,
                Friedrichshafen (DE)

( * ) Notice: Subject to any disclaimer, the term of this
              patent is extended or adjusted under 35
              U.S.C. 154(b) by 440 days.

(21) Appl. No.: 18/363,406

(22) Filed: Aug. 1, 2023

(65) Prior Publication Data

US 2024/0038639 A1     Feb. 1, 2024

(30) Foreign Application Priority Data

Aug. 1, 2022    (DE) .......................... 102022207922.1

(51) Int. Cl.
     *H01L 23/495*      (2006.01)
     *H01L 23/00*       (2006.01)
     *H01L 23/31*       (2006.01)
     *H01L 23/373*      (2006.01)

(52) U.S. Cl.
     CPC .... *H01L 23/49568* (2013.01); *H01L 23/3121*
            (2013.01); *H01L 23/3735* (2013.01); *H01L*
                   *23/49562* (2013.01); *H01L 23/49575*
            (2013.01); *H01L 24/48* (2013.01); *H01L*
                                    *2224/48245* (2013.01)

(58) Field of Classification Search
     None
     See application file for complete search history.

(56) References Cited

U.S. PATENT DOCUMENTS

2008/0224285 A1     9/2008  Lim et al.
2020/0235558 A1 *   7/2020  Hass ........................ H01L 23/62
2021/0358835 A1 *  11/2021  Inokuchi ................. H01L 23/48
2022/0406745 A1 *  12/2022  Pavlicek ............... H01L 25/072

FOREIGN PATENT DOCUMENTS

DE     10 2018 123 857 A1     4/2019

OTHER PUBLICATIONS

Office Action dated Mar. 8, 2023 for German Patent Application No.
10 2022 207 922.1 (12 pp.), note: pp. 1 and 2 are English language
Explanations to Section C. Result of Determination Document.

* cited by examiner

*Primary Examiner* — Sue A Purvis
*Assistant Examiner* — Jordan M Klein
(74) *Attorney, Agent, or Firm* — Crowell & Moring LLP

(57) ABSTRACT

A power electronics module, having a continuous DBC PCB
having power semiconductors arranged on connecting
regions of an uppermost layer of said DBC PCB and a lead
frame arranged above the power semiconductors for three-
dimensional power and control routing, wherein the lead
frame has a drain-source connection, which can be brought
into electrical contact with a drain-source contact of the
PCB, and a load-source connection which is opposite the
drain-source connection via the power semiconductors and
which is formed from a plurality of subregions, each of
which can be brought into electrical contact with one of the
power semiconductors, and at least one gate-source terminal
and at least one kelvin-source terminal, and a carrier element
including an electrically insulating material on which con-
ductor tracks are provided, wherein the carrier element is
routed between the power semiconductors in a region
between the load-source connection and the drain-source
connection.

14 Claims, 4 Drawing Sheets

POWER ELECTRONICS MODULE

CROSS-REFERENCE TO RELATED APPLICATION

This application claims priority to German Application No. DE 10 2022 207 922.1, filed on Aug. 1, 2022, the entirety of which is hereby fully incorporated by reference herein.

FIELD

The present invention relates to the field of electromobility, in particular of electronics modules.

BACKGROUND AND SUMMARY

The use of electronics modules, for example power electronics modules, in motor vehicles has increased significantly in recent decades. This can be attributed firstly to the need to improve the fuel saving and the vehicle performance and secondly to the advances in semiconductor technology.

In order to be able to provide the energy, a multiplicity of electronics component parts is required with which, for example, bridge circuits (for example half-bridges) are realized, for example semiconductor power switches, which are also referred to as power semiconductors. Power semiconductors can be installed in complete power electronics modules (also referred to as power modules) or as discrete component parts.

Power electronics modules have a printed circuit board having power semiconductors arranged thereon which have been brought into electrical contact with one another on the printed circuit board for power and control routing. So-called lead frames, i.e. metal line carriers for producing electrical connections to the inside and to the outside are also already available. The positioning of the power semiconductors on the printed circuit board is in this case driven to a high degree by the producibility of the lead frame.

In current power electronics modules, in addition often parts of the printed circuit board, which is generally in the form of a DBC printed circuit board, for conducting signals are separated from the power semiconductors, with the result that they no longer have any advantageous thermal influence and therefore result in a reduction in the power density of the component part.

The invention is based on the object of providing a power electronics module by means of which the abovementioned disadvantages are improved. This object is achieved by the features of the independent claims. Advantageous configurations are the subject matter of the dependent claims.

What is proposed is a power electronics module, having a continuous DBC printed circuit board having power semiconductors arranged on connecting regions of an uppermost layer of said DBC printed circuit board and a lead frame arranged above the power semiconductors for three-dimensional power and control routing, wherein the lead frame has: a drain-source connection, which can be brought into electrical contact with a drain-source contact of the printed circuit board, and a load-source connection which is opposite the drain-source connection via the power semiconductors and which is formed from a plurality of subregions, each of which can be brought into electrical contact with one of the power semiconductors, and at least one gate-source terminal and one kelvin-source terminal, characterized by a carrier element consisting of an electrically insulating material, on which conductor tracks are provided, wherein the carrier element is routed between the power semiconductors in a region between the load-source connection and the drain-source connection.

In one embodiment, wire bonds are provided which electrically connect the conductor tracks of the carrier element to the power semiconductors and/or the gate- and kelvin-source terminals.

In one embodiment, the carrier element is formed in such a way that it is routed to the gate- and kelvin-source terminals and/or to the power semiconductors, with the result that the conductor tracks provide an electrical contact-connection between the power semiconductors and/or the gate- and kelvin-source terminals.

In one embodiment, the carrier element is formed in such a way that one of the conductor tracks is arranged on a first side of the carrier element which faces the DBC printed circuit board and the other conductor track is arranged on an opposite second side of the carrier element.

In one embodiment, an electrically insulating element is provided between the load-source connection and the conductor track which faces the load-source connection.

In one embodiment, the carrier element is routed centrally between the power semiconductors.

In one embodiment, the carrier element is routed above or below the load-source connection of the lead frame.

In one embodiment, the carrier element is formed from glass, plastic or ceramic.

In one embodiment, the DBC printed circuit board, the power semiconductors and those parts of the carrier element and the lead frame which are arranged in the region of the DBC printed circuit board are surrounded by a casting compound.

In addition, the use of the power electronics module for driving the electric drive of a vehicle equipped with an electric drive is provided.

In addition, an electric drive of a motor vehicle is provided, having the power electronics module which is formed for driving the electric drive. Likewise, a motor vehicle is provided having the electric drive.

Further features and advantages of the invention will become apparent from the following description of exemplary embodiments according to the invention with reference to the figures of the drawing, which shows the details according to the invention, and from the claims. The individual features may each be implemented on their own or together in any desired combination in one variant of the invention.

Preferred embodiments of the invention will be explained in more detail below with reference to the appended drawing.

DETAILED DESCRIPTION

Figure 1:
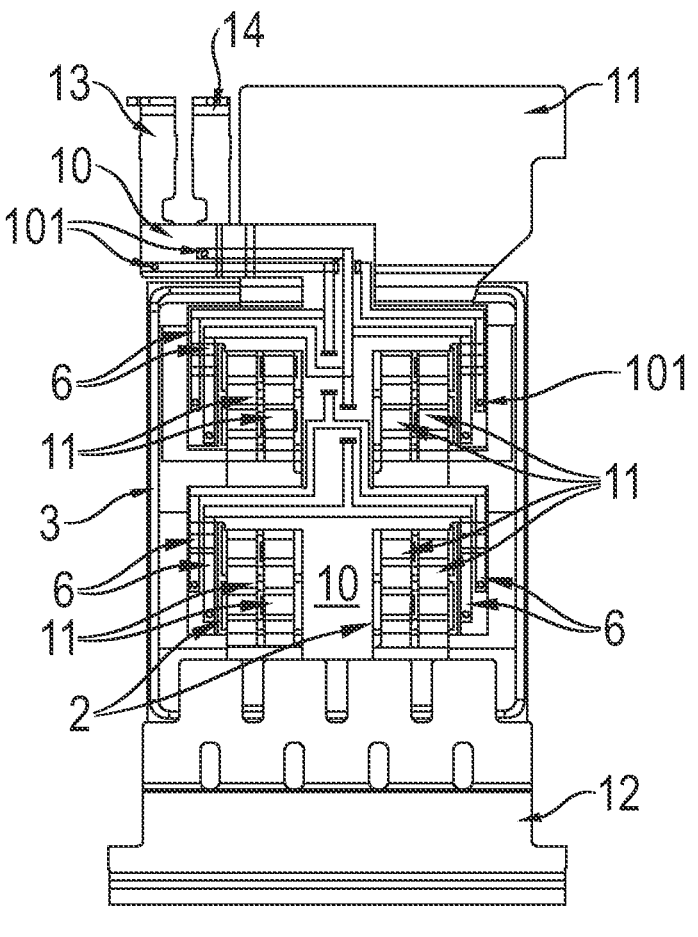
FIG. 1 shows a plan view of a power electronics module in accordance with one embodiment of the present invention.

In the description of the figures below, identical elements or functions have been provided with the same reference signs.

As has already been mentioned at the outset, often parts of the printed circuit board 3 for conducting signals are separated from the power semiconductors 2 in current power electronics modules, with the result that they no longer have any advantageous thermal influence, and this leads to a reduction in the power density of the component part (the power semiconductor 2). The positioning of the power semiconductors 2 is also to a large extent dependent on the producibility of the lead frame 1, with the result that often a distribution on the printed circuit board 3 which is optimal for the respective application cannot take place.

In order to achieve an improved power density in the case of power electronics modules, according to the invention no separation of parts of the DBC printed circuit board 3 takes place any more, i.e. the DBC printed circuit board 3 is formed to be continuous. Therefore, an optimal distribution of the power semiconductors 2 on the DBC printed circuit board 3 can take place. In addition, a single lead frame 1 is used for the power contact-connection of drain and source, i.e. a drain-source connection 12 is provided which has been brought into electrical contact with a drain-source contact of the DBC printed circuit board 3. In addition, the lead frame 1 has a load-source connection 11 arranged above the power semiconductors 2 and a gate-source terminal 13 arranged outside of the DBC printed circuit board 3 and a kelvin-source terminal 14. The load-source connection 11 has a plurality of subregions, each of which has been brought into electrical contact with one of the power semiconductors 2, as can be seen, for example, in FIGS. 1 to 6. The load-source connection 11 and the drain-source connection 12 lie on mutually opposite end regions of the DBC printed circuit board 3. That is to say that they lie opposite one another via the power semiconductors 2 and/or the DBC printed circuit board 3, as is shown in the figures.

The printed circuit board 3 is in the form of a DBC (direct bonded copper) printed circuit board 3, also referred to below as DBC 3 for short. Power semiconductors 2 which can be brought into electrical contact via corresponding connections (bonds, soldered joints, etc.) for power and control routing are arranged on the DBC printed circuit board 3.

The subregion of the lead frame 1 which forms the load-source connection 11 is shaped in such a way that it can provide the contact-connection of the power semiconductors 2, for example by one or more corresponding curvatures, as can be seen in the figures. As a result, a hollow interspace can be formed into which a casting or mold compound can be introduced during fitting, which casting or mold compound is used for electrical insulation and for mechanical stabilization of the components.

In order to provide (electrical) signal routing between power semiconductors 2 and gate-source and kelvin-source terminals 13, 14 via the load-source connection 11, a carrier element 10 consisting of an electrically insulating material is provided. The material from which the carrier element 10 is formed is advantageously glass, but can also be a plastic or a ceramic. It is important that the insulating clearances between the different potentials (lead frame 1 and DBC printed circuit board 3) are maintained by the thickness of the carrier element 10.

Figure 8:
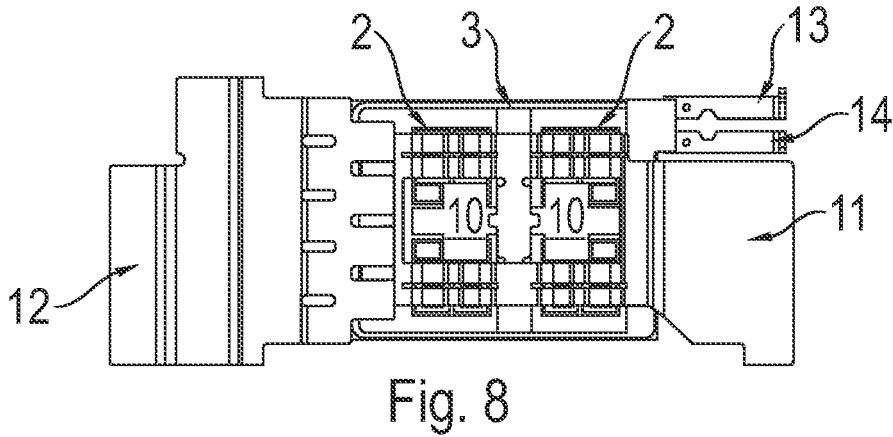
FIGS. 8 and 9 each show a plan view of a power electronics module in accordance with further embodiments of the present invention.
Figure 9:
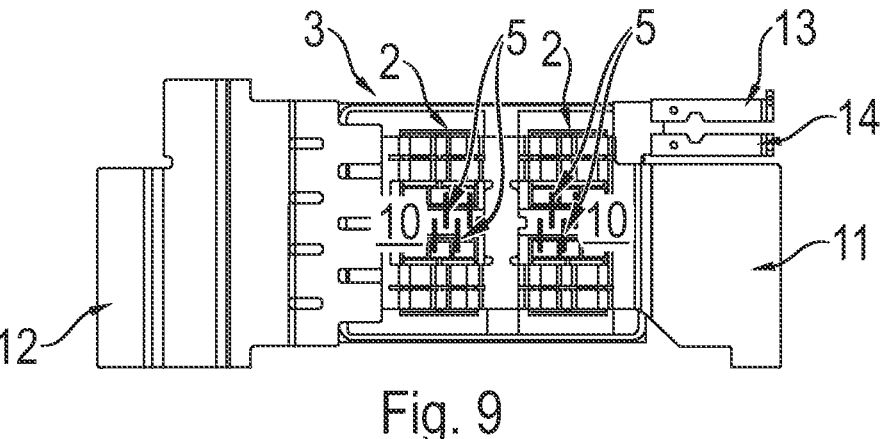

The carrier element 10 is arranged either above the load-source connection 11 (FIGS. 1 to 6) or beneath the load-source connection 11, i.e. between power semiconductors 2 and load-source connection 11 (FIGS. 8 and 9).

Two conductor tracks 6 (one carries positive and one carries negative) for signal routing between the power semiconductors 2 and the gate-source terminal 13 and the power semiconductors 2 and the kelvin-source terminal 14, i.e., electrically conductive connections, are always provided on the carrier element 10. The conductor tracks 6 are applied to the carrier element 10 by means of a suitable method (depending on the material).

By virtue of the provision, in accordance with the invention, of the carrier element 10, the power and control routings routed previously on the printed circuit board are routed on a lead frame 1 with a plurality of layers. This enables three-dimensional power and signal routing within the package (unmolded power electronics module) without the use of the DBC 3 for the signal contact-connection and without a compromise in terms of the arrangement/connection of the power semiconductors 2 being required since they can now optimally be arranged on the DBC 3.

The carrier element 10 can be embodied differently, as will be described below with reference to the figures.

The carrier element 10 is routed with the conductor tracks 6 arranged thereon between the load-source connection 11 and the drain-source connection 12 and between the power semiconductors 2. In the configurations shown in the figures, it is routed centrally between the power semiconductors 2, i.e. forms a straight line. A first end region of the carrier element 10 is arranged approximately at the level of the gate- and kelvin-source terminals 13, 14 in the region of the load-source connection 11, and a second end region thereof advantageously ends in front of the drain-source connection 12.

In order to produce the electrical connection between the conductor tracks 6 and the power semiconductors 2 and the gate- and kelvin-source terminals 13 and 14, in one embodiment the carrier element 10 can be routed up to the power semiconductors 2 and the gate- and kelvin-source terminals 13 and 14, as is illustrated in FIGS. 1 to 3 and 5 to 8. In these embodiments, subregions of the carrier element 10 are routed as the subregions of the load-source connection 11 (but next to them) to the power semiconductors 2 by means of one or more curvatures or bends. In addition, a subregion of the carrier element 10 is routed at its first end region to the corresponding gate- and kelvin-source terminals 13 and 14. The electrical contact only takes place in the region of the terminals on the underside of the carrier element 10, for example by means of vias 101, in order to produce a conductive connection.

Figure 2:
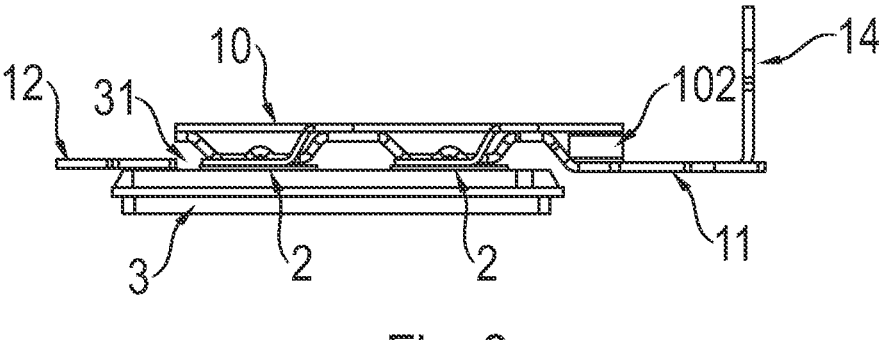
FIG. 2 shows the power electronics module shown in FIG. 1 in a side view.
Figure 3:
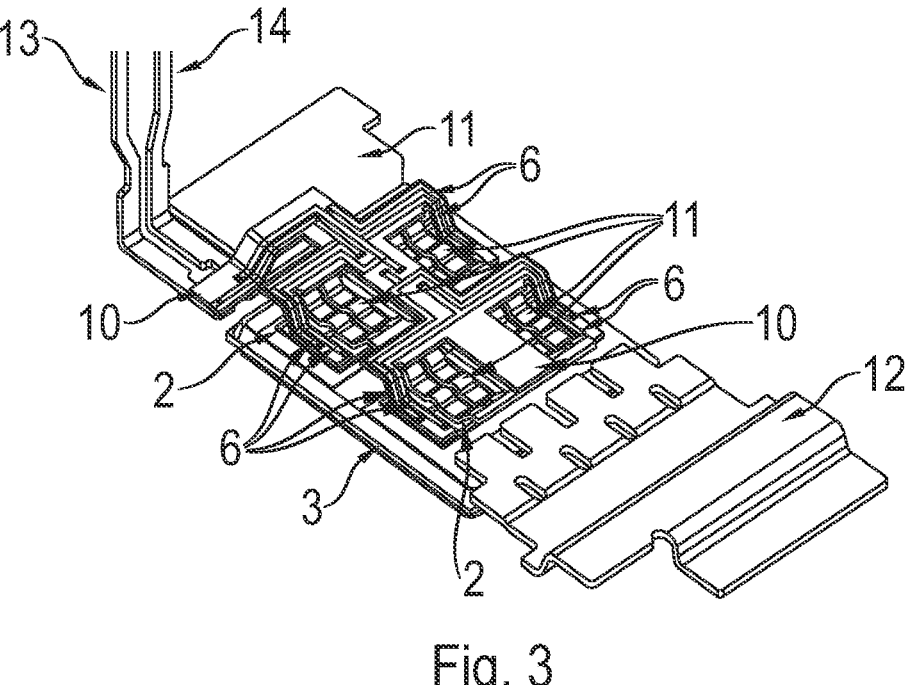
FIG. 3 shows an angled plan view of the power electronics module shown in FIG. 1.

In the embodiment shown in FIGS. 1 to 3, the two carrying (positive and negative) conductor tracks 6 are arranged on the same side of the carrier element 10, preferably on that side of the carrier element 10 which does not point towards the power semiconductors 2.

Figure 5:
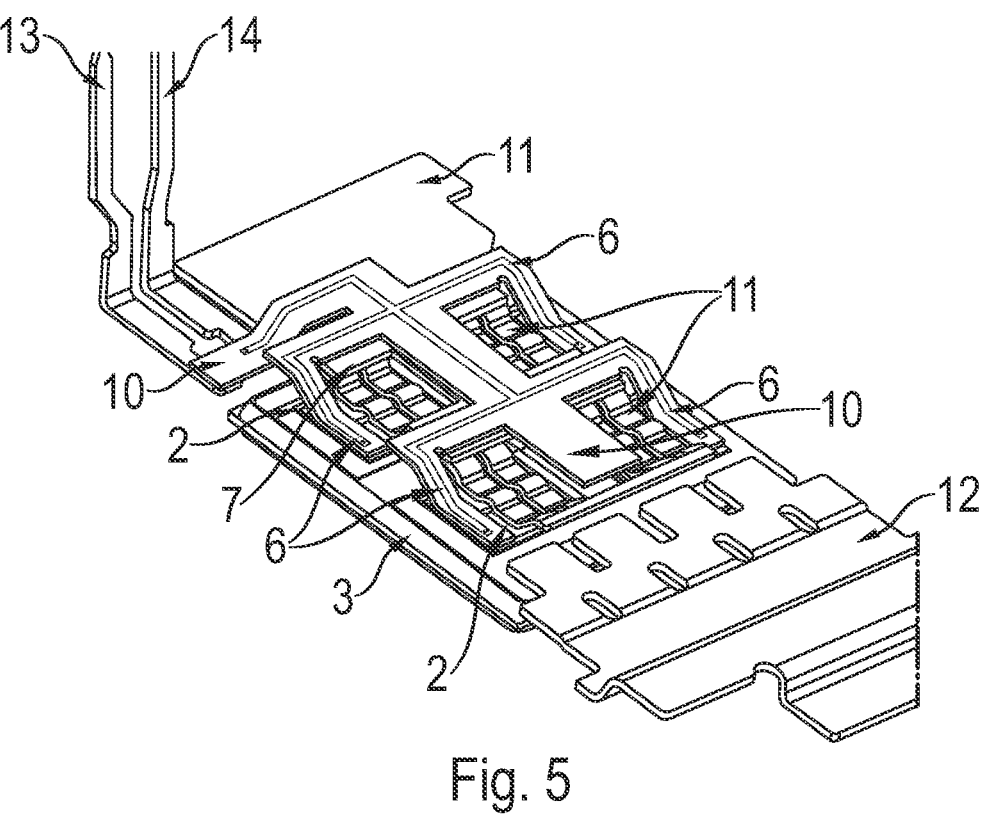
FIGS. 5 and 6 show an angled plan view of a power electronics module in accordance with a further embodiment of the present invention.
Figure 6:
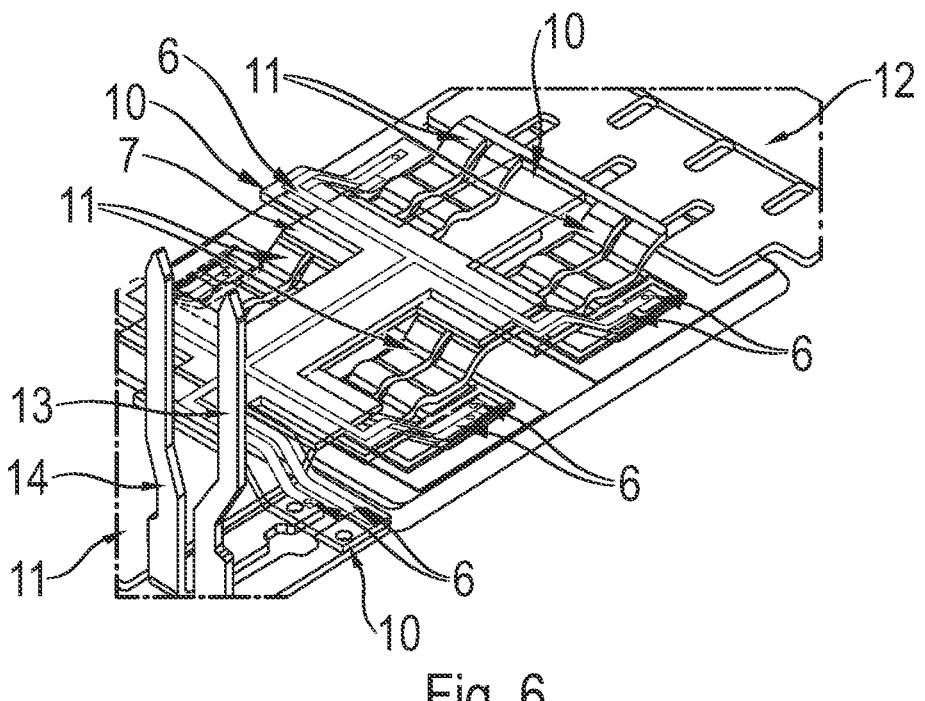
Figure 7:
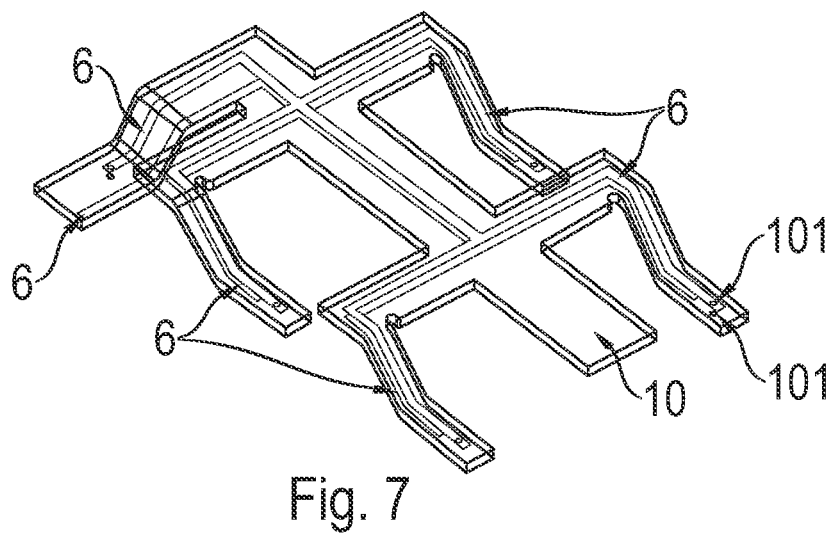
FIG. 7 shows a view of a glass carrier used in FIGS. 5 and 6 with lines for routing signals.

In the embodiment shown in FIGS. 5 to 7, in each case one of the conductor tracks 6 is arranged on one side of the carrier element 10, i.e. they are arranged opposite one another via the carrier element 10, as is illustrated schematically in FIG. 7. In this embodiment, an additional electrically insulating element 7, insulation element 7 for short, is required which is provided between the carrier element 10 and the load-source connection 11. This insulation element 7 prevents a direct electrical contact and therefore short circuit and can likewise be formed from glass, ceramic or plastic. By virtue of the arrangement on both sides of the carrier element 10, a more uniform coupling-in of interference is achieved.

Figure 4:
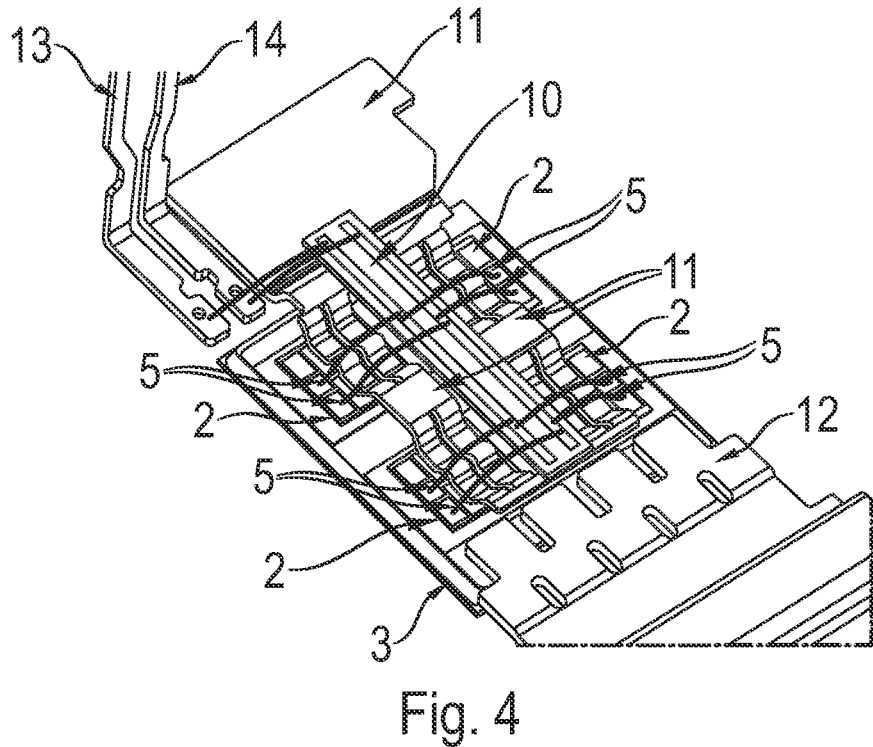
FIG. 4 shows an angled plan view of a power electronics module in accordance with a further embodiment of the present invention.

In order to produce the electrical connection between the conductor tracks 6 and the power semiconductors 2 and the gate- and kelvin-source terminals 13 and 14, in a further embodiment wire bonds 5 can be used, as is illustrated in FIGS. 4 and 9. The difference between the embodiments consists in that, in the embodiment shown in FIG. 4, the carrier element 10 is arranged above the load-source connection 11, whereas, in the embodiment shown in FIG. 9, the carrier element 10 is arranged beneath the load-source connection 11.

The advantage of a line routing on the upper side of the carrier element 10 is that it can be routed on the source part (the load-source connection 11) of the lead frame 1 without the insulation being impaired. The carrier element 10 is fastened at the points of contact 102 with the source part (the load-source connection 11) of the lead frame 1 in order to enable stable line routing in the process chain. The fastening can take place by adhesives or sintered/soldered/welded joints.

In all embodiments, an electrically insulating compound, which can also be used as heat dissipation, is advantageously provided in the region of the DBC 3 and between the DBC 3 and the lead frame 1. Such a casting or mold compound can be a resin or another compound which is introduced into the power electronics module and cured during the production process. The casting or mold compound in this case flows into all free regions, i.e. even into the intermediate regions between the subregions of the lead frame 1 and the power semiconductors 2 as well as the DBC 3. This casting or mold compound is also used as mechanical stabilization of the individual components during fitting.

Owing to the fact that the signals lines (these are taken over by the carrier element 10 with conductor tracks 6 and possibly additional wire bonds 5) which are generally routed on the DBC 3 are dispensed with, an optimal distribution of the power semiconductors 2 on the complete surface of the DBC 3 is enabled. Therefore, an optimal thermal link with maximum possible semiconductor surface in the module can be achieved.

The term power semiconductor 2 includes both individual topological switches and half-bridges/B6 bridges. The lead frame 1 is advantageously formed from an electrically conductive metal sheet which is suitable for stamping and bending.

A power electronics module within the scope of this invention is used for operating an electric motor of a motor vehicle driven by means of a rechargeable battery fuel cell. The motor vehicle is in particular a utility vehicle such as an HGV or a bus or a passenger car. The power electronics module comprises an inverter. It can also comprise a rectifier, a DC/DC converter, a transformer and/or another electrical converter or part of such a converter or some of these. In particular, the power electronics module serves to supply current to an electric machine, for example an electric motor and/or a generator. An inverter is preferably used to generate a polyphase alternating current from a direct current generated by means of a DC voltage of an energy source, for example a battery. A DC/DC converter is used, for example, to convert (step up) a direct current coming from a fuel cell into a direct current that can be used by the drive.

DC/DC converters and inverters for electric drives of vehicles, in particular passenger cars and utility vehicles, such as buses, are configured for the high-voltage range and are in particular configured in a blocking voltage class of above approximately 650 volts.

The described inverter arrangement can be used, for example, in motor vehicles. The motor vehicle can in particular have an electrically driven axle. The motor vehicle can in principle be in the form of a purely combustion engine-based motor vehicle, a hybrid motor vehicle or an electric vehicle.

LIST OF REFERENCE SIGNS 1 lead frame
10 carrier element consisting of an electrically insulating material, for example glass carrier
101 via
102 points of contact with 10 and 11
11 load-source
12 drain-source
13 gate-source
14 kelvin-source
2 power semiconductor
3 DBC printed circuit board
31 uppermost layer of 3
5 wire bonds
6 lines for signal routing; conductor tracks
7 electrically insulating element (insulation element)

The invention claimed is:

1. A power electronics module, comprising:
a continuous direct bonded copper (DBC) printed circuit board having power semiconductors arranged on connecting regions of an uppermost layer of said DBC printed circuit board; and
a lead frame arranged above the power semiconductors for three-dimensional power and control routing, wherein the lead frame comprises:
a drain-source connection configured to be brought into electrical contact with a drain-source contact on the printed circuit board;
a load-source connection opposite the drain-source connection via the power semiconductors, and which is formed from a plurality of subregions, each of which can be brought into electrical contact with one of the power semiconductors; and
at least one gate-source terminal and at least one kelvin-source terminal; and
a carrier element comprising an electrically insulating material on which conductor tracks are provided, wherein the carrier element is routed between the power semiconductors in a region between the load-source connection and the drain-source connection.

2. The power electronics module according to claim 1, comprising:
wire bonds that electrically connect the conductor tracks of the carrier element to the power semiconductors.

3. The power electronics module according to claim 1, comprising:
wire bonds that electrically connect the conductor tracks of the carrier element to the at least one gate-source terminal and/or the kelvin-source terminal.

4. The power electronics module according to claim 1, wherein the carrier element is formed in such a way that it is routed to the at least one gate-source terminal and the at least one kelvin-source terminal and/or to the power semiconductors, wherein the conductor tracks are configured to provide an electrical contact-connection between the power semiconductors and/or the at least one gate-source terminal and the at least one kelvin-source terminal.

5. The power electronics module according to claim 4, wherein the carrier element is formed in such a way that one of the conductor tracks is arranged on a first side of the carrier element which faces the DBC printed circuit board and another conductor track is arranged on an opposite second side of the carrier element.

6. The power electronics module according to claim 5, comprising:

an electrically insulating element provided between the load-source connection and the conductor track which faces the load-source connection.

7. The power electronics module according to claim 1, wherein the carrier element is routed centrally between the power semiconductors.

8. The power electronics module according to claim 1, wherein the carrier element is routed above the load-source connection of the lead frame.

9. The power electronics module according to claim 1, wherein the carrier element is routed below the load-source connection of the lead frame.

10. The power electronics module according to claim 1, wherein the carrier element is formed from glass, plastic, or ceramic.

11. The power electronics module according to claim 1, wherein the DBC printed circuit board, the power semiconductors, and parts of the carrier element and the lead frame that are arranged in the region of the DBC printed circuit board are surrounded by a casting compound.

12. The use of a power electronics module according to claim 1 for driving an electric drive of a vehicle equipped with the electric drive.

13. An electric drive of a motor vehicle, comprising the power electronics module according to claim 1, which is configured to drive the electric drive.

14. A motor vehicle, comprising the electric drive according to claim 13.

* * * * *